(12) United States Patent
Kim et al.

(10) Patent No.: US 9,653,373 B2
(45) Date of Patent: May 16, 2017

(54) SEMICONDUCTOR PACKAGE INCLUDING HEAT SPREADER AND METHOD FOR MANUFACTURING THE SAME

(71) Applicant: SAMSUNG ELECTRONICS CO., LTD., Suwon-si, Gyeonggi-Do (KR)

(72) Inventors: Jae Choon Kim, Incheon (KR); Heejung Hwang, Suwon-si, Gyeonggi-do (KR); Eon Soo Jang, Suwon-si, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/976,218

(22) Filed: Dec. 21, 2015

(65) Prior Publication Data

US 2016/0300774 A1 Oct. 13, 2016

(30) Foreign Application Priority Data

Apr. 9, 2015 (KR) .................. 10-2015-0050149
Jun. 2, 2015 (KR) .................. 10-2015-0077974

(51) Int. Cl.

| | |
|---|---|
| H01L 23/34 | (2006.01) |
| H01L 23/367 | (2006.01) |
| H01L 23/433 | (2006.01) |
| H01L 23/498 | (2006.01) |
| H01L 21/48 | (2006.01) |
| H01L 23/31 | (2006.01) |
| H01L 21/56 | (2006.01) |

(52) U.S. Cl.
CPC ........ *H01L 23/367* (2013.01); *H01L 21/4871* (2013.01); *H01L 23/3142* (2013.01); *H01L 23/4334* (2013.01); *H01L 23/49816* (2013.01); *H01L 21/561* (2013.01); *H01L 23/3128* (2013.01)

(58) Field of Classification Search
CPC ............. H01L 23/367; H01L 23/3142; H01L 23/49816; H01L 23/4334; H01L 21/4871; H01L 23/3128; H01L 21/561
See application file for complete search history.

(56) References Cited

U.S. PATENT DOCUMENTS

| | | |
|---|---|---|
| 6,794,223 B2 | 9/2004 | Ma et al. |
| 7,601,561 B2 | 10/2009 | Im et al. |
| 8,642,386 B2 | 2/2014 | Lu |

(Continued)

FOREIGN PATENT DOCUMENTS

| | | |
|---|---|---|
| JP | 2011159701 | 8/2011 |
| JP | 2013-143526 | 7/2013 |

(Continued)

*Primary Examiner* — Victor A Mandala
(74) *Attorney, Agent, or Firm* — F. Chau & Associates, LLC

(57) ABSTRACT

A semiconductor package includes a semiconductor chip on a package substrate, a heat spreader on the semiconductor chip, a molding layer, an adhesive film between the semiconductor chip and the heat spreader, and a through-hole passing through the heat spreader. The heat spreader includes a first surface and a second surface. The molding layer covers sidewalls of the semiconductor chip and the heat spreader and exposes the first surface of the heat spreader. The adhesive film is on the second surface of the heat spreader.

8 Claims, 17 Drawing Sheets

(56) References Cited

U.S. PATENT DOCUMENTS

| | | | |
|---|---|---|---|
| 8,679,900 B2 | 3/2014 | Choi et al. | |
| 2006/0118969 A1* | 6/2006 | Yuan | H01L 23/16 257/778 |
| 2006/0278974 A1 | 12/2006 | Hsiao et al. | |
| 2007/0228530 A1 | 10/2007 | Sato et al. | |
| 2012/0104591 A1* | 5/2012 | Warren | H01L 23/4334 257/712 |
| 2013/0208426 A1 | 8/2013 | Kim et al. | |
| 2014/0191386 A1* | 7/2014 | Lee | H01L 23/42 257/712 |
| 2015/0340303 A1* | 11/2015 | Oh | H01L 21/486 257/692 |
| 2016/0293514 A1* | 10/2016 | Lin | H01L 24/83 |

FOREIGN PATENT DOCUMENTS

| | | |
|---|---|---|
| KR | 100714186 | 4/2007 |
| KR | 1020060025166 | 4/2007 |
| KR | 1020090106727 | 10/2009 |
| KR | 1020120129542 | 11/2012 |

\* cited by examiner

SEMICONDUCTOR PACKAGE INCLUDING HEAT SPREADER AND METHOD FOR MANUFACTURING THE SAME

CROSS-REFERENCE TO RELATED APPLICATIONS

This application claims priority under 35 U.S.C. §119 to Korean Patent Application No. 10-2015-0050149, filed on Apr. 9, 2015 in the Korean Intellectual Property Office and Korean Patent Application No. 10-2015-0077974, filed on Jun. 2, 2015, in the Korean Intellectual Property Office, the disclosures of which are incorporated by reference herein in their entirety.

TECHNICAL FIELD

The present inventive concept relates to semiconductor devices and, more particularly, to semiconductor packages and a method for manufacturing the same.

DISCUSSION OF THE RELATED ART

In general, sizes of semiconductor packages have been reduced as sizes of electronic devices have been reduced. A semiconductor package including a semiconductor device mounted on a printed circuit board (PCB) protects the semiconductor device from an outer environment and electrically connects the semiconductor device to an outer device.

SUMMARY

In accordance with an example embodiment of the present inventive concept, a semiconductor package may include a semiconductor chip on a package substrate, a heat spreader on the semiconductor chip, the heat spreader including a first surface and a second surface, a molding layer covering sidewalls of the semiconductor chip and the heat spreader and exposing the first surface of the heat spreader, an adhesive film between the semiconductor chip and the heat spreader, wherein the adhesive film is on the second surface of the heat spreader, and a through-hole passing through the heat spreader.

In an example embodiment of the present inventive concept, the first surface of the heat spreader may be even and the second surface of the heat spreader may be uneven.

In an example embodiment of the present inventive concept, a portion of the second surface of the heat spreader may be directly in contact with the semiconductor chip.

In an example embodiment of the present inventive concept, the first surface of the heat spreader may be even, a first portion of the second surface of the heat spreader may be uneven and a second portion of the second surface of the heat spreader may be even.

In an example embodiment of the present inventive concept, the second portion of the second surface of the heat spreader may be directly in contact with the semiconductor chip, and a part of the first portion of the second surface of the heat spreader is directly in contact with the semiconductor chip.

In an example embodiment of the present inventive concept, the through-hole may penetrate the heat spreader and may extend from the first surface of the heat spreader to the first portion of the second surface of the heat spreader.

In an example embodiment of the present inventive concept, the through-hole may expose the adhesive film.

In an example embodiment of the present inventive concept, the first surface of the heat spreader may be substantially coplanar with a first surface of the molding layer.

In an example embodiment of the present inventive concept, a surface roughness of the second surface of the heat spreader may be greater than a surface roughness of the first surface of the heat spreader.

In an example embodiment of the present inventive concept, the adhesive film may include a thermosetting material.

In accordance with an example embodiment of the present inventive concept, a semiconductor package device may include a semiconductor chip on a package substrate, a heat spreader on the semiconductor chip, a molding layer covering sidewalls of the heat spreader and sidewalls of the semiconductor chip, and an adhesive film disposed between the heat spreader to the semiconductor chip. The heat spreader may include a first surface exposed by the molding layer and a second surface facing the semiconductor chip and having a surface roughness greater than a surface roughness of the first surface.

In an example embodiment of the present inventive concept, the adhesive film may include a thermosetting material.

In an example embodiment of the present inventive concept, the first surface of the heat spreader may be even and the second surface of the heat spreader may be uneven. A portion of the second surface of the heat spreader may be directly in contact with the semiconductor chip.

In an example embodiment of the present inventive concept, the semiconductor package may further include a plurality of through-holes penetrating the heat spreader and exposing the adhesive film.

In an example embodiment of the present inventive concept, the second surface of the heat spreader may include protrusion portions and recessed portions between the protrusion portions. The protrusion portions may be directly in contact with the semiconductor chip. The adhesive film may be in the recessed portions.

In an example embodiment of the present inventive concept, the protrusion portions may have a sharp tip or a curved tip.

In an example embodiment of the present inventive concept, the protrusion potions may have an even surface.

In an example embodiment of the present inventive concept, the adhesive film may be on a portion of the first surface of the heat spreader, the sidewalls of the heat spreader and the sidewalls of the semiconductor chip.

In accordance with an example embodiment of the present inventive concept, a semiconductor package may include a semiconductor chip on a package substrate, a first heat spreader on the semiconductor chip; an adhesive film on a portion of a first surface and sidewalls of the first heat spreader and sidewalls of the semiconductor chip, and a molding layer on a portion of the adhesive film and covering the sidewalls of the first heat spreader and the semiconductor chip. The first heat spreader may include the first surface exposed by the adhesive film and a second surface facing the semiconductor chip and contacting the semiconductor chip.

In an example embodiment of the present inventive concept, the semiconductor package may further include a second heat spreader on the first surface of the first heat spreader and in contact with the first heat spreader.

In an example embodiment of the present inventive concept, the first heat spreader may extend to a first surface of the molding layer.

In an example embodiment of the present inventive concept, the adhesive film may extend to a first surface of the package substrate at sides of the semiconductor chip.

In accordance with an example embodiment of the present inventive concept, a method for manufacturing a semiconductor package may include mounting a semiconductor chip on a package substrate, bonding a heat spreader to the semiconductor chip by an adhesive film, the heat spreader including a first surface, a second surface that has a surface roughness greater than a surface roughness of the first surface and at least one through-hole therein, and covering sidewalls of the heat spreader and the semiconductor chip with a molding layer.

In an example embodiment of the present inventive concept, the molding layer may include a first surface substantially coplanar with the first surface of the heat spreader.

In an example embodiment of the present inventive concept, the adhesive film may be between the semiconductor chip and the heat spreader and may be exposed by the at least one through-hole.

In an example embodiment of the present inventive concept, the at least one through-hole may include a plurality of through-holes penetrating the heat spreader and may emit a bubble generated between the semiconductor chip and the heat spreader when the heat spreader is bonded to the semiconductor chip.

In an example embodiment of the present inventive concept, the bonding of the heat spreader may include contacting a portion of the second surface of the heat spreader and the semiconductor chip with each other.

In an example embodiment of the present inventive concept, the second surface of the heat spreader may include protrusion portions and recessed portions between the protrusion portions and the adhesive film may be in the recessed portions.

In an example embodiment of the present inventive concept, the protrusion portions may include a sharp or curved tip In accordance with an example embodiment of the present inventive concept, a method for manufacturing a semiconductor package may include mounting a semiconductor chip on a package substrate, disposing a first heat spreader on the semiconductor chip, the first heat spreader including a metal, a first surface and a second surface, bonding the semiconductor chip to the first heat spreader with an adhesive film, and covering sidewalls of the first heat spreader and the semiconductor chip with a molding layer. The disposing a first heat spreader may include contacting at least a portion of the second surface of the first heat spreader and the semiconductor chip. The second surface of the first heat spreader may have a surface roughness greater than a surface roughness of the first surface of the first heat spreader.

In an example embodiment of the present inventive concept, the adhesive film is on the second surface of the first heat spreader.

In an example embodiment of the present inventive concept, the disposing a first heat spreader may further include forming a plurality of through-holes penetrating the first heat spreader.

In an example embodiment of the present inventive concept, the bonding the semiconductor chip to the first heat spreader may include attaching the adhesive film to a portion of the first surface of the first heat spreader, the sidewalls of the first heat spreader and the sidewalls of the semiconductor chip.

In an example embodiment of the present inventive concept, the method may further include disposing a second heat spreader on the first surface of the first heat spreader and a first surface of the molding layer, the second heat spreader being in contact with the first heat spreader.

In accordance with an example embodiment of the present inventive concept, a semiconductor package may include: a semiconductor chip disposed on a substrate; a heat spreader disposed on the semiconductor chip; an adhesive film disposed on sidewalls of the heat spreader and the semiconductor chip, wherein a first surface of the heat spreader is exposed by the adhesive film; and a molding layer disposed on the adhesive film along the sidewalls of the heat spreader and the sidewalls of the semiconductor chip.

In an example embodiment of the present inventive concept, the heat spreader may include a high thermal conductive material.

In an example embodiment of the present inventive concept, edges of the first surface of the heat spreader may be covered by the adhesive film.

BRIEF DESCRIPTION OF THE DRAWINGS

The above and other features of the present inventive concept will become more apparent by describing in detail example embodiments thereof, with reference to the accompanying drawings in which:

FIG. 1D is an enlarged view illustrating a portion of a structure including a heat spreader illustrated in FIG. 1C, according to an example embodiment of the present inventive concept;

FIG. 1E is a cross-sectional view illustrating the structure including the heat spreader illustrated in FIG. 1D, according to an example embodiment of the present inventive concept;

DETAILED DESCRIPTION OF THE EMBODIMENTS

Figure 1A:
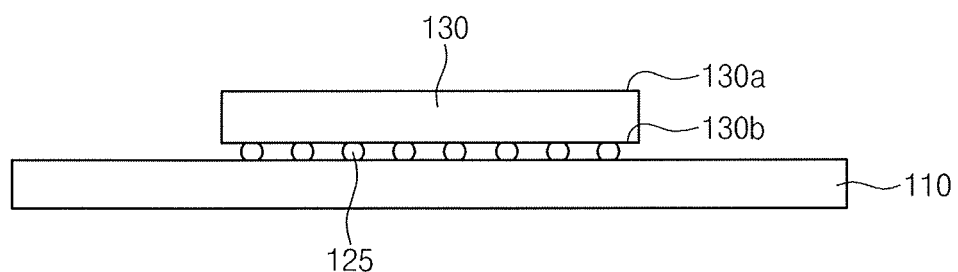
FIGS. 1A, 1B, 1C, 1D, 1E and 1F are cross-sectional views illustrating a method of manufacturing a semiconductor package according to an example embodiment of the present inventive concept.

Example embodiments of the present inventive concept will now be described more fully hereinafter with reference to the accompanying drawings. It should be noted, however, that the present inventive concept is not limited to the following example embodiments, and may be implemented in various forms. In the drawings, the sizes of layers and regions may be exaggerated for clarity.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

Additionally, the example embodiments will be described with sectional views and/or plan views as ideal views of the present inventive concept. Accordingly, shapes of the views may be modified according to manufacturing techniques and/or allowable errors. Therefore, the example embodiments of the present inventive concept are not limited to the specific shape illustrated in the views, but may include other shapes that may be created according to manufacturing processes.

The same reference numerals or the same reference designators may denote the same elements throughout the specification.

Figure 1B:
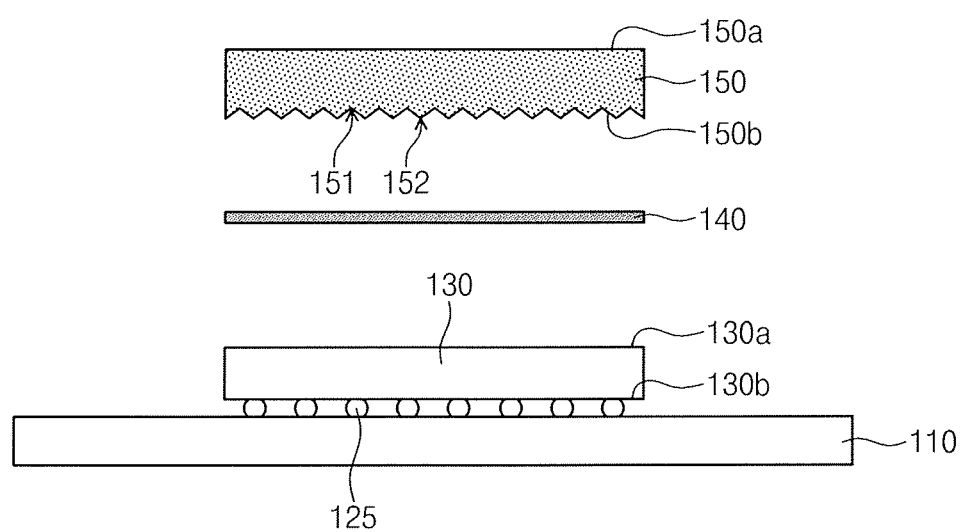
Figure 1C:
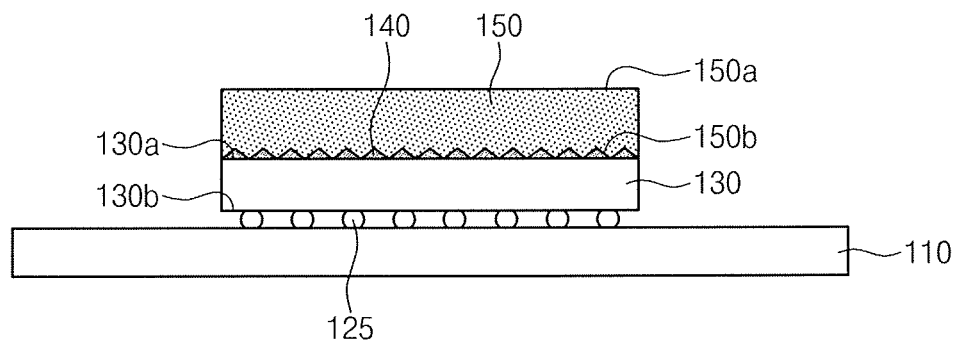
Figure 1D:
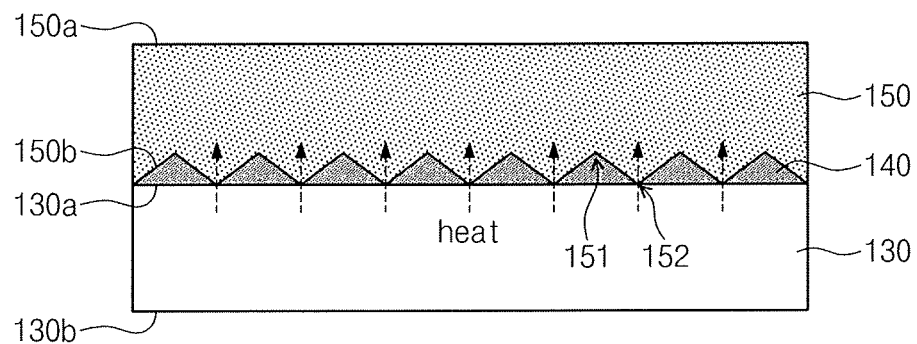
Figure 1E:
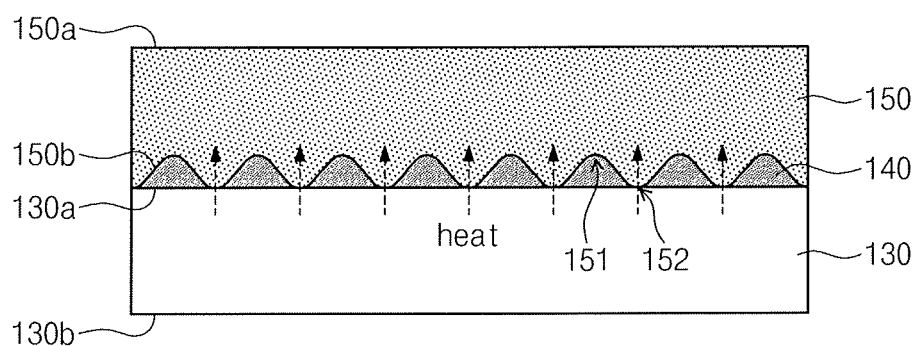

FIGS. 1A, 1B, 1C, 1D, 1E and 1F are cross-sectional views illustrating a method of manufacturing a semiconductor package according to an example embodiment of the present inventive concept. FIG. 1D is an enlarged view illustrating a portion of a structure including a heat spreader illustrated in FIG. 1C, according to an example embodiment of the inventive concept. FIG. 1E is a cross-sectional view illustrating the structure including the heat spreader illustrated in FIG. 1D, according to an example embodiment of the present inventive concept. FIGS. 1G and 1H are cross-sectional views illustrating a structure in which a semiconductor chip is mounted on a substrate, according to an example embodiment of the present inventive concept.

Referring to FIG. 1A, a semiconductor chip 130 may be mounted on a package substrate 110. The semiconductor chip 130 may include a memory chip, a logic chip, or a combination thereof. As an example, the semiconductor chip 130 may be an application processor (AP). The semiconductor chip 130 may include a top surface 130a and a bottom surface 130b opposite to the top surface 130a. In an example embodiment of the present inventive concept, the top surface 130a of the semiconductor chip 130 may be an inactive surface, whereas the bottom surface 130b of the semiconductor chip 130 may be an active surface on which integrated circuits are disposed. In an example embodiment of the present inventive concept, the top surface 130a of the semiconductor chip 130 may be an active surface on which integrated circuits are disposed, whereas the bottom surface 130b of the semiconductor chip 130 may be an inactive surface. The semiconductor chip 130 may be mounted on the package substrate 110 in a manner in which the bottom surface 130b of the semiconductor chip 130 faces a top surface of the package substrate 110. The semiconductor chip 130 may be mounted on the package substrate 110 by a flip-chip bonding technique. Solder balls 125 may be provided between the semiconductor chip 130 and the package substrate 110 to connect the semiconductor chip 130 to the package substrate 110. In an example embodiment of the present inventive concept, as illustrated in FIG. 1G, an underfill member 127 may be further provided between the semiconductor chip 130 and the package substrate 110 with the solder balls 125 interposed therebetween.

In an example embodiment of the present inventive concept, as illustrated in FIG. 1H, through silicon vias (TSVs) 129 may be provided in the semiconductor chip 130. The TSVs 129 may completely or partially penetrate the semiconductor chip 130 and may be connected to the solder balls 125. The underfill member 127 may be further provided between the semiconductor chip 130 and the package substrate 110 with the solder balls 125 interposed therebetween.

Referring to FIG. 1B, a heat spreader 150 may be provided. The heat spreader 150 may include a metal or a metal alloy which has a high thermal conductivity. The heat spreader 150 may include, for example, copper, aluminum, copper alloy, and/or aluminum alloy. The heat spreader 150 may include a top surface 150a and a bottom surface 150b.

The heat spreader 150 may have a plate-type shape. The bottom surface 150*b* of the heat spreader 150 may have a surface roughness greater than that of the top surface 150*a*. As an example, the top surface 150*a* of the heat spreader 150 may be even, but the bottom surface 150*b* of the heat spreader 150 may be uneven. The bottom surface 150*b* of the heat spreader 150 may include protrusion portions 152 and recessed portions 151 between the protrusion portions 152. Each of the protrusion portions 152 may have a sharp tip, for example, a pointed tip. The bottom surface 150*b* of the heat spreader 150 may be processed using a sand-blasting process or a peening process to become uneven. In an example embodiment of the present inventive concept, the bottom surface 150*b* of the heat spreader 150 may be processed using a chiseling process to become uneven.

An adhesive film 140 may be provided to bond the heat spreader 150 to the top surface 130*a* of the semiconductor chip 130. The adhesive film 140 may be provided on the bottom surface 150*b* of the heat spreader 150. For example, the adhesive film 140 may be attached to the bottom surface 150*b* of the heat spreader 150. The adhesive film 140 may include a silicone or a thermosetting material including silicone. In an example, the adhesive film 140 may include a siloxane-based material or an epoxy-based material. In another example, the adhesive film 140 may include tripropylenemelamine (TMAT) or a material including TMAT.

Referring to FIG. 1C, the heat spreader 150 with the adhesive film 140 which is provided on the bottom surface 150*b* thereof may be stacked on the top surface 130*a* of the semiconductor chip 130. Sidewalls of the heat spreader 150 may be aligned with sidewalls of the semiconductor chip 130. As illustrated in FIG. 1D, since the bottom surface 150*b* of the heat spreader 150 may be uneven, a contact area between the adhesive film 140 and the bottom surface 150*b* of the heat spreader 150 may be greater than a case where the bottom surface 150*b* of the heat spreader 150 is even. Thus, a bonding strength between the heat spreader 150 and the adhesive film 140 may be increased, thereby preventing or reducing an adhesion failure between the semiconductor chip 130 and the heat spreader 150. In other words, due to the bonding strength between the heat spreader 150 and the adhesive film 140, the heat spreader 150 may be prevented from being separated from the semiconductor chip 130.

The protrusion portions 152 of the bottom surface 150*b* of the heat spreader 150 may be directly in contact with the semiconductor chip 130. Accordingly, an efficient heat transfer from the semiconductor chip 130 to the heat spreader 150 may be facilitated. The adhesive film 140 may be provided in the recessed portions 151 of the bottom surface 150*b* of the heat spreader 150. The adhesive film 140 may fill the recessed portions 151 of the bottom surface 150*b* of the heat spreader 150. In an example embodiment of the present inventive concept, the bottom surface 150*b* of the heat spreader 150 may include the protrusion portions 152, each of which has a curved tip as illustrated in FIG. 1E.

Figure 1F:
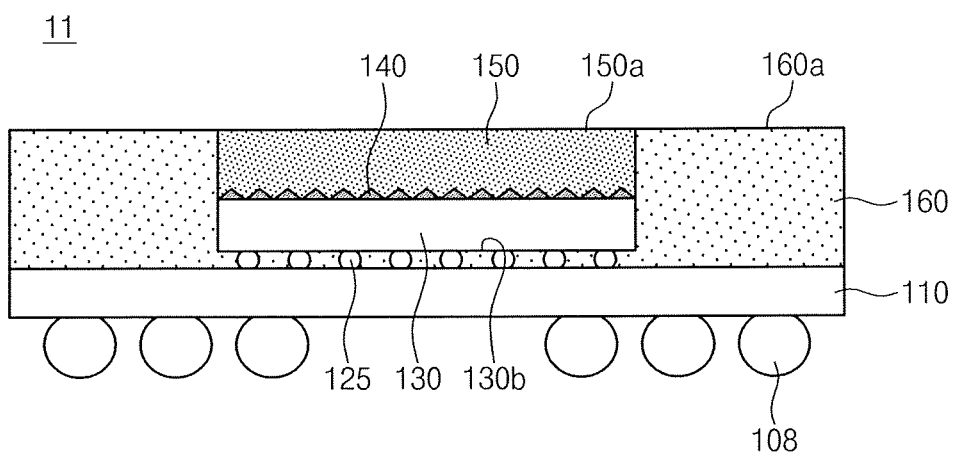
Figure 1G:
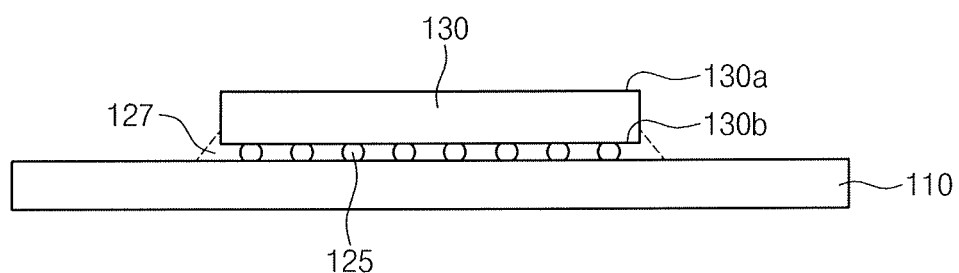
FIGS. 1G and 1H are cross-sectional views illustrating a structure in which a semiconductor chip is mounted on a substrate, according to an example embodiment of the present inventive concept.
Figure 1H:
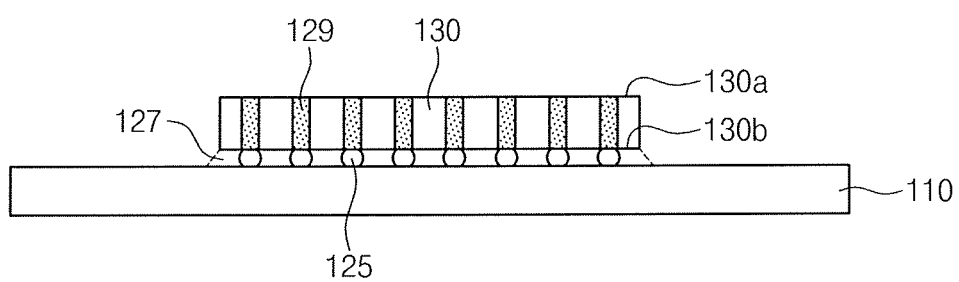

Referring to FIG. 1F, a molding layer 160 may be provided on the package substrate 110. The molding layer 160 may cover sidewalls of the heat spreader 150 and the semiconductor chip 130. A top surface 160*a* of the molding layer 160 may be substantially coplanar with the top surface 150*a* of the heat spreader 150. Since the top surface 150*a* of the heat spreader 150 may be exposed, a heat generated from the semiconductor chip 130 may be emitted to the outside via the heat spreader 150. The mold layer 160 may be further provided between the semiconductor chip 130 and the package substrate 110 with the solder balls 125 interposed therebetween. The mold layer 160 may be fill a space between the bottom surface 130*b* of the semiconductor chip 130 and the top surface of the package substrate 110 with the solder balls 125 interposed therebetween.

External connection terminals 108 may be provided on a bottom surface of the package substrate 110. As a result, by the processes described above, a semiconductor package 11 may be realized.

The semiconductor package 11 may include the semiconductor chip 130 and the heat spreader 150 on the semiconductor chip 130. Since a portion of the heat spreader 150 may be directly in contact with the semiconductor chip 130, the heat generated from the semiconductor chip 130 may be emitted without using an additional heat spreader. Therefore, a thickness of the semiconductor package 11 may be reduced. In addition, since the heat spreader 150 is formed of a hard material (e.g., a metal), warpage of the semiconductor package 11 is inhibited or reduced. The adhesive film 140 may include a thermosetting material, so a bonding strength between the semiconductor chip 130 and the heat spreader 150 may be maintained when the semiconductor package 11 operates at a high temperature.

Figure 2A:
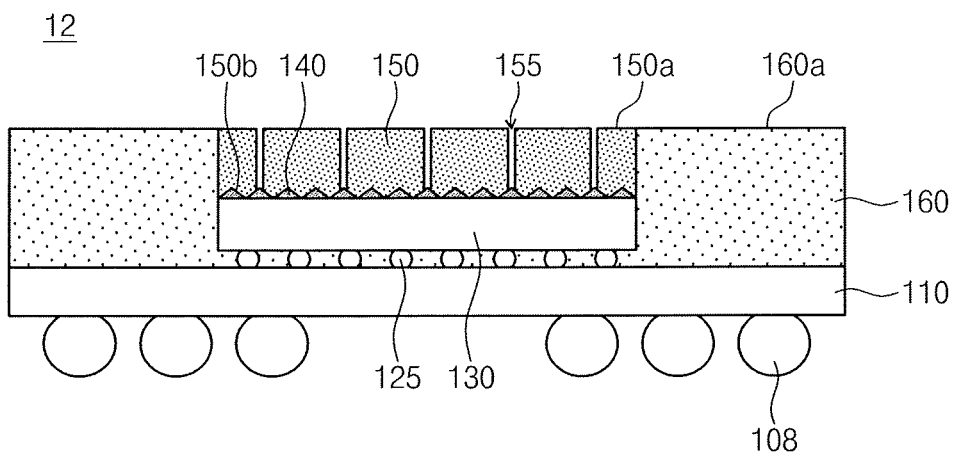
FIG. 2A is a cross-sectional view illustrating a semiconductor package according to an example embodiment of the present inventive concept.
Figure 2B:
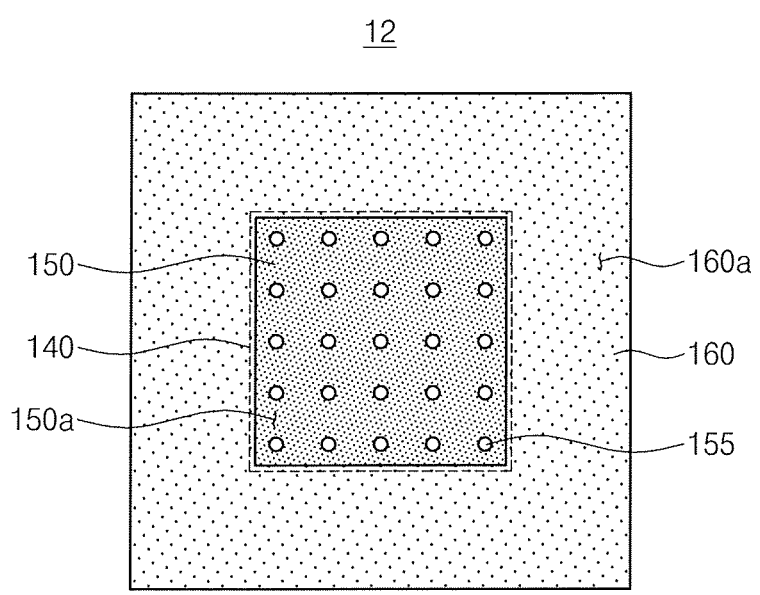
FIG. 2B is a plan view of the semiconductor package illustrated in FIG. 2A, according to an example embodiment of the present inventive concept.
Figure 2C:
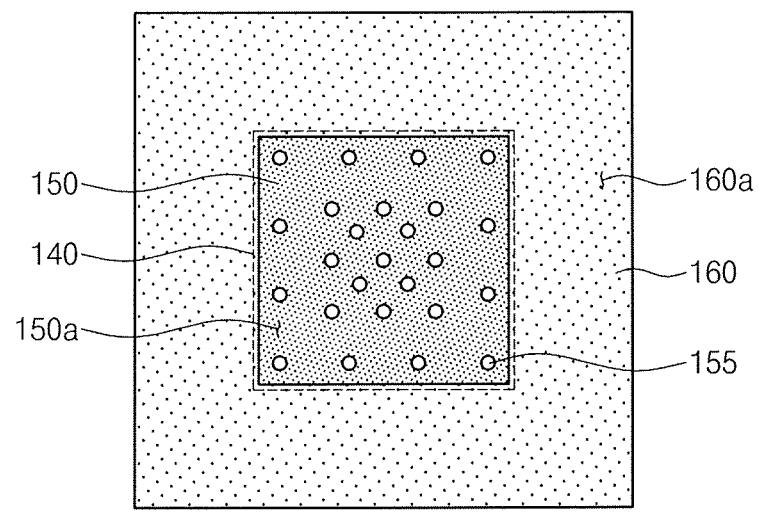
FIG. 2C is a plan view illustrating the semiconductor package illustrated in 2A, according to an example embodiment of the present inventive concept.
Figure 2D:
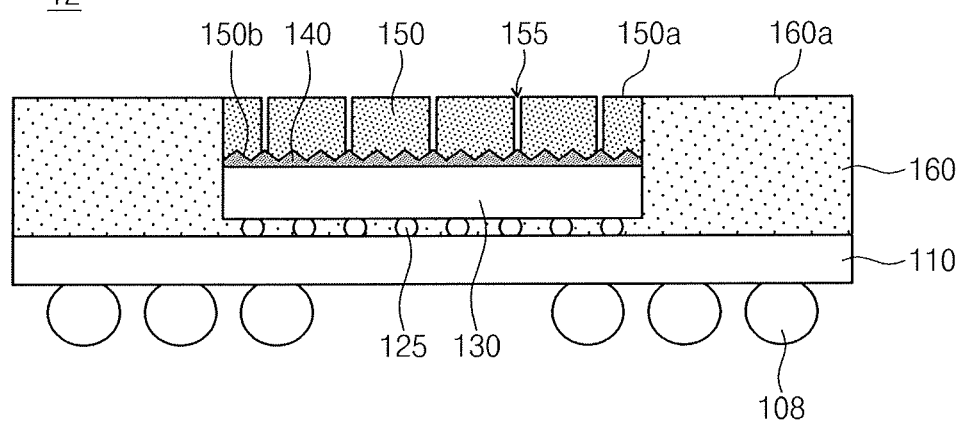
FIG. 2D is a cross-sectional view illustrating the semiconductor package illustrated in FIG. 2A, according to an example embodiment of the present inventive concept.

FIG. 2A is a cross-sectional view illustrating a semiconductor package according to an example embodiment of the present inventive concept. FIG. 2B is a plan view of the semiconductor package illustrated in FIG. 2A, according to an example embodiment of the present inventive concept. FIG. 2C is a plan view illustrating the semiconductor package illustrated in 2A, according to an example embodiment of the present inventive concept. FIG. 2D is a cross-sectional view illustrating the semiconductor package illustrated in FIG. 2A, according to an example embodiment of the present inventive concept.

Referring to FIGS. 2A, 2B, 2C and 2D, a semiconductor package 12 may further include a plurality of through-holes 155 that penetrate the heat spreader 150. The through-holes 155 may extend from the top surface 150*a* of the heat spreader 150 to the bottom surface 150*b* of the heat spreader 150 in a thickness direction of the heat spreader 150. The thickness direction of the heat spreader 150 may be a direction perpendicular to the surface of the package substrate 110. The through-holes 155 may be formed using a mechanical or laser drilling process. As an example, the through-holes 155 may be formed before the adhesive film 140 is provided on the bottom surface 150*b* of the heat spreader 150. As another example, the through-holes 155 may be formed before the heat spreader 150 with the adhesive film 140 provided on the bottom surface 150*b* thereof is stacked on the semiconductor chip 130.

The top surface 150*a* of the heat spreader 150 may be even and may be coplanar with the top surface 160*a* of the molding layer 160. In an example embodiment of the present inventive concept, the bottom surface 150*b* of the heat spreader 150 may be an uneven surface. In other words, the bottom surface 150*b* of the heat spreader 150 may include the protrusion portions 152, each of which has a sharp tip as illustrated in FIG. 1D. In an example embodiment of the present inventive concept, the bottom surface 150*b* of the heat spreader 150 may be an uneven surface and may include the protrusion portions 152, each of which has a curved tip as illustrated in FIG. 1E.

The through-holes 155 may penetrate the heat spreader 150 and may extend from the top surface 150*a* of the heat spreader 150 to the bottom surface 150*b* of the heat spreader 150. The heat spreader 150 may be opened at both of the top and bottom surfaces 150*a* and 150*b* of the heat spreader 150 by the through-holes 155. The through-holes 155 may be regularly arranged to form an array as illustrated in FIG. 2B.

For example, the through-holes 155 may be arranged in a shape of a matrix. In an example embodiment of the present inventive concept, the through-holes 155 may be irregularly arranged as illustrated in FIG. 2C. For example, the number of the through-holes 155 distributed in a center region of the heat spreader 150 may be greater than that of the through-holes 155 distributed in a peripheral region of the heat spreader 150.

The through-holes 155 may expose a portion of the adhesive film 140. When the heat spreader 150 is bonded to the semiconductor chip 130, a bubble may be formed in the adhesive film 130 and/or between the heat spreader 150 and the semiconductor chip 130. The bubble may weaken an adhesive ability of the adhesive film 140 and/or may obstruct the heat transfer from the semiconductor chip 130 to the heat spreader 150. In accordance with an example embodiment of the present inventive concept, the through-holes 155 may serve as a path for emitting the bubble, thereby preventing or reducing a deterioration of the adhesive ability of the adhesive film 140 and/or a deterioration in the heat transfer from the semiconductor chip 130 to the heat spreader 150.

The adhesive film 140 may be thick enough to separate the bottom surface 150b of the heat spreader 150 from the semiconductor chip 130 as illustrated in FIG. 2D. Thus, the bond strength between the heat spreader 150 and the semiconductor chip 130 may be increased by the adhesive film 140.

Figure 3A:
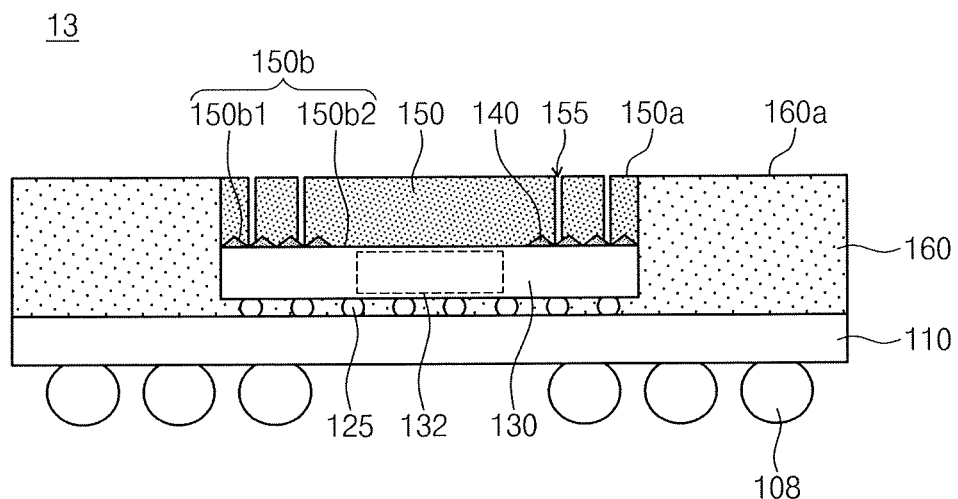
FIG. 3A is a cross-sectional view illustrating a semiconductor package according to an example embodiment of the present inventive concept.
Figure 3B:
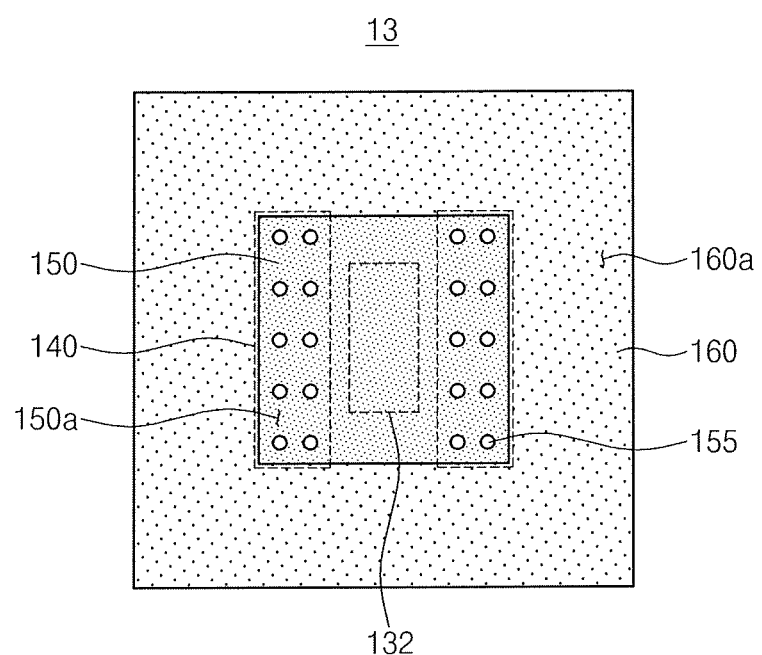
FIG. 3B is a plan view of the semiconductor package illustrated in FIG. 3A, according to an example embodiment of the present inventive concept.

FIG. 3A is a cross-sectional view illustrating a semiconductor package according to an example embodiment of the present inventive concept. FIG. 3B is a plan view of the semiconductor package illustrated in FIG. 3A, according to an example embodiment of the present inventive concept.

Referring to FIGS. 3A and 3B, a semiconductor package 13 may include a heat spreader 150 having a bottom surface 150b that has various ranges of surface roughness. The bottom surface 150b of the heat spreader 150 may include a first bottom surface 150b1 and a second bottom surface 150b2. The first bottom surface 150b1 of the heat spreader 150 may have a surface roughness greater than the second bottom surface 150b2 of the heat spreader 150. For example, the first bottom surface 150b1 of the heat spreader 150 may include recessed portions and protrusion portions similar to or the same as the recessed portions 151 and the protrusion portions 152 of the bottom surface 150b of the heat spreader 150 illustrated in FIGS. 1D and/or 1E. The adhesive film 140 may be locally provided on the first bottom surface 150b1 of the heat spreader 150 as illustrated in FIG. 5B. In a case where a central processing unit (CPU) generating a lot of heat is disposed in a portion 132 of the semiconductor chip 130, the second bottom surface 150b2 of the heat spreader 150 may be in contact with the portion 132. Thus, heat dissipated to the heat spreader 150 from the CPU may be increased. As an example, in a case where the portion 132 in which CPU is disposed is a central region of the semiconductor chip 130, the adhesive film 140 may be provided on both peripheral regions of the heat spreader 150 as illustrated by the dashed rectangles in FIG. 3B. In this case, the second bottom surface 150b2 of the heat spreader 150 may be contact with the central region of the semiconductor chip 130. The semiconductor package 13 may further include through-holes 155 passing through the heat spreader 150. The through-holes 155 may expose the adhesive film 140 on the first bottom surface 150b1 of the heat spreader 150.

Figure 4A:
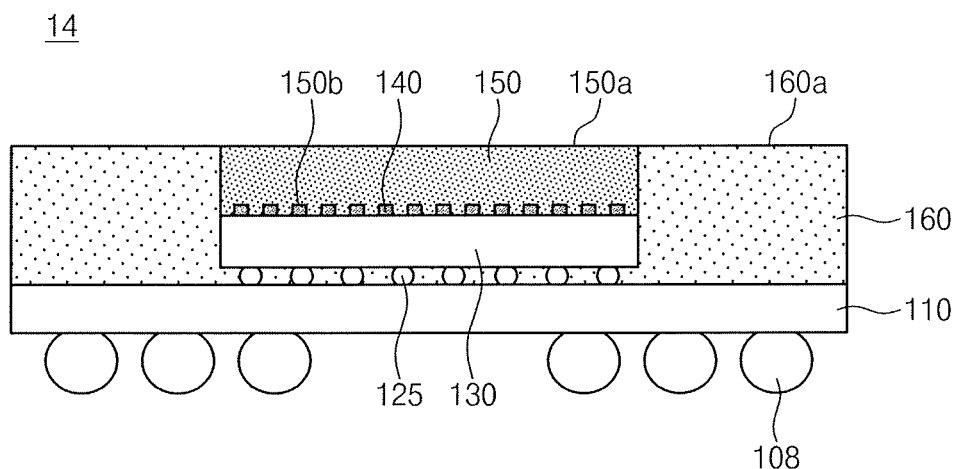
FIG. 4A is a cross-sectional view illustrating a semiconductor package according to an example embodiment of the present inventive concept.
Figure 4B:
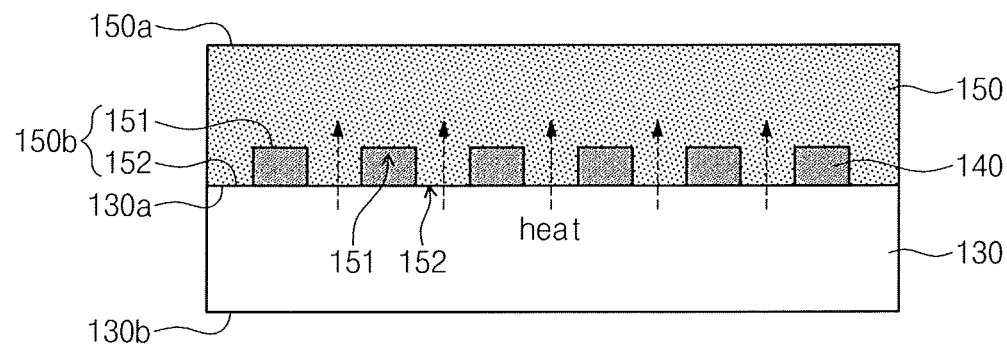
FIG. 4B is a cross-sectional view illustrating a portion of a structure including a heat spreader illustrated in FIG. 4A, according to an example embodiment of the present inventive concept.
Figure 4C:
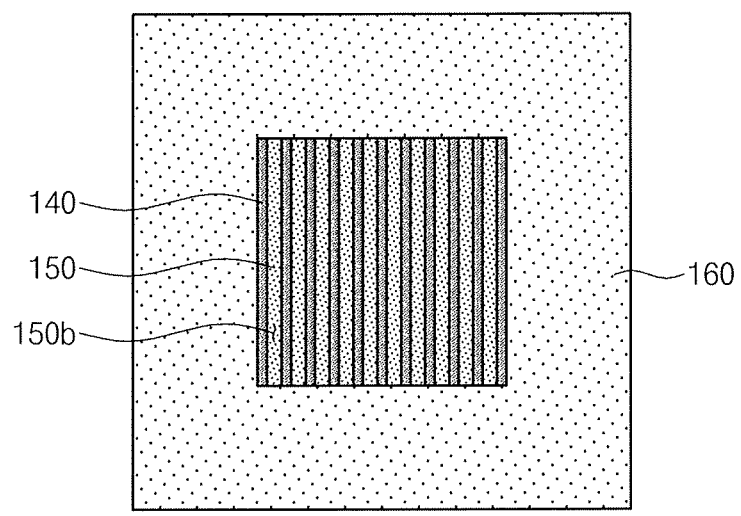
FIG. 4C is a plan view of the semiconductor package illustrated in FIG. 4A, according to an example embodiment of the present inventive concept.

FIG. 4A is a cross-sectional view illustrating a semiconductor package according to an example embodiment of the present inventive concept. FIG. 4B is a cross-sectional view illustrating a portion of a structure including a heat spreader illustrated in FIG. 4A, according to an example embodiment of the present inventive concept. FIG. 4C is a plan view of the semiconductor package illustrated in FIG. 4A, according to an example embodiment of the present inventive concept.

Referring to FIGS. 4A, 4B and 4C, a semiconductor package 14 may include a heat spreader 150 including a bottom surface 150b having an uneven surface. The bottom surface 150b of the heat spreader 150 may include protrusion portions 152 and recessed portions 151 between the protrusion portions 152. As illustrated in FIG. 4B, each of the protrusion portions 152 which is in contact with the semiconductor chip 130 may have an even surface, and the adhesive film 140 may be provided in the recessed portions 151. The adhesive film 140 may fill the recessed portions 151. Thus, heat may be easily transferred from the semiconductor chip 130 to the heat spreader 150 through the protrusion portions 152. As illustrated in FIG. 4C, the adhesive film 140 may be formed in a plurality of linear shapes which are uniformly distributed on the bottom surface 150a of the heat spreader 150. In other words, each of the recessed portions 151 may have a shape extending in a line.

Figure 5A:
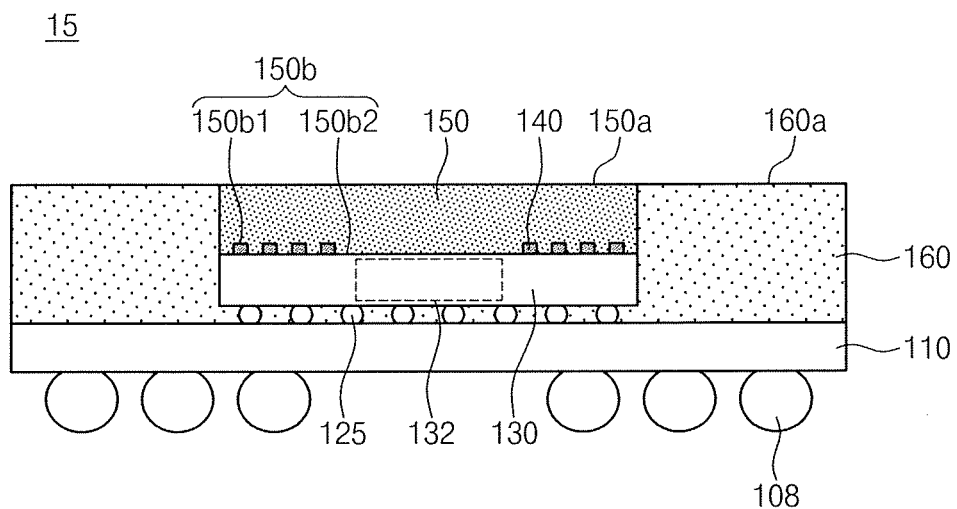
FIG. 5A is a cross-sectional view illustrating a semiconductor package according to an example embodiment of the present inventive concept.
Figure 5B:
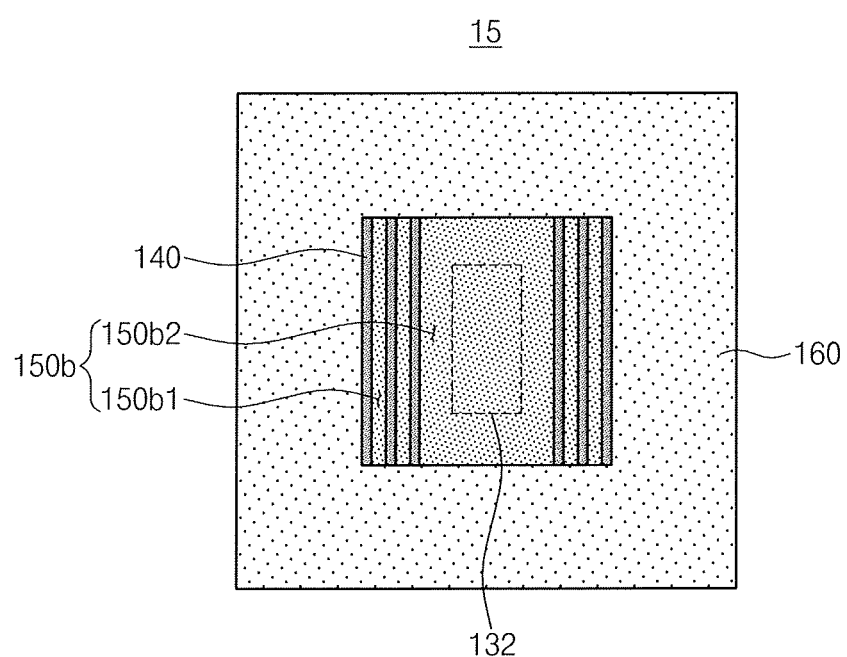
FIG. 5B is a plan view of the semiconductor package illustrated in FIG. 5A, according to an example embodiment of the present inventive concept.

FIG. 5A is a cross-sectional view illustrating a semiconductor package according to an example embodiment of the present inventive concept. FIG. 5B is a plan view of the semiconductor package illustrated in FIG. 5A, according to an example embodiment of the present inventive concept.

FIGS. 5A and 5B, a semiconductor package 15 may include a heat spreader 150 having a bottom surface 150b that includes various ranges of surface roughness. The bottom surface 150b of the heat spreader 150 may include a first bottom surface 150b1 and a second bottom surface 150b2. The first bottom surface 150b1 may have a surface roughness greater than that of the second bottom surface 150b2. The first bottom surface 150b1 may include recessed portions and protrusion portions similar to or the same as the recessed portions 151 and the protrusion portions 152 illustrated in FIG. 4B. The second bottom surface 150b2 may have an even surface similar or the same as the surfaces of the protrusion portions 152 illustrated in FIG. 4B. The adhesive film 140 may be locally provided on the first bottom surface 150b1 of the heat spreader 150 as illustrated in FIG. 5B. The second bottom surface 150b2 of the heat spreader 150 may be in contact with the semiconductor chip 130. In a case where a CPU generating a lot of heat is disposed in a portion 132 of the semiconductor chip 130, the second bottom surface 150b2 of the heat spreader 150 may be in contact with the portion 132.

Figure 6A:
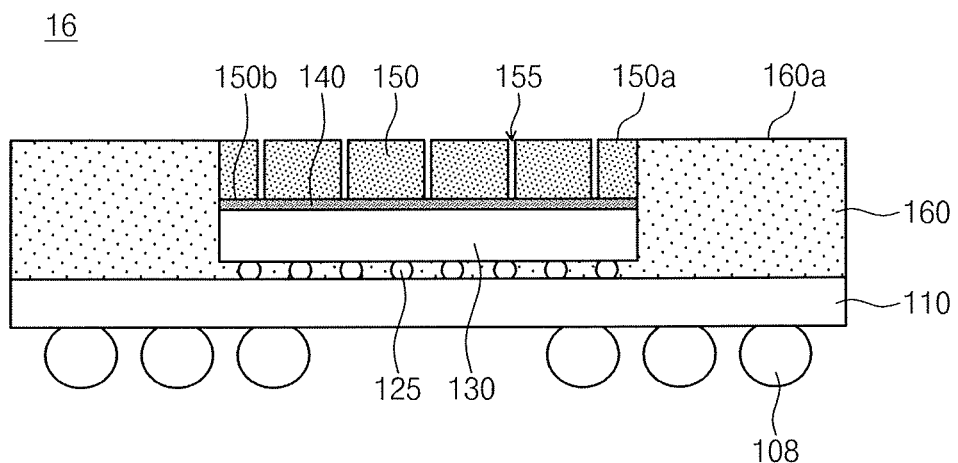
FIG. 6A is a cross-sectional view illustrating a semiconductor package according to an example embodiment of the present inventive concept.
Figure 6B:
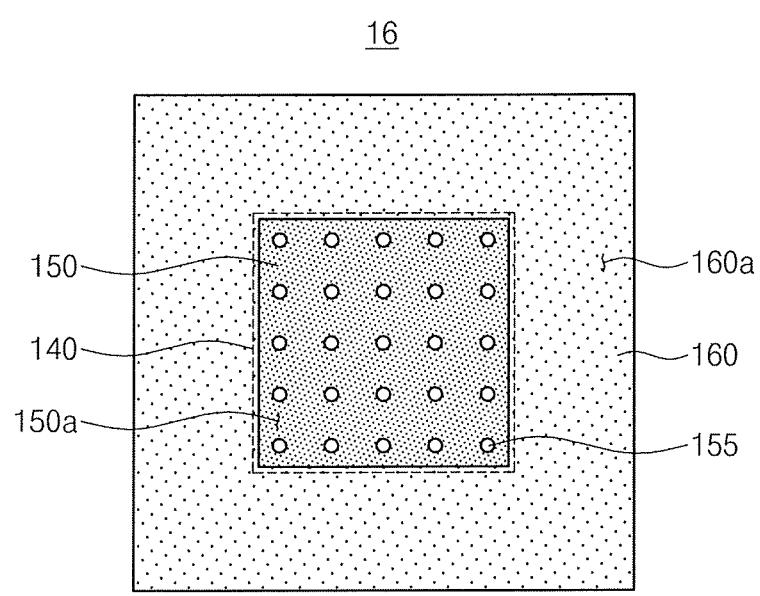
FIG. 6B is a plan view of the semiconductor package illustrated in FIG. 6A, according to an example embodiment of the present inventive concept.

FIG. 6A is a cross-sectional view illustrating a semiconductor package according to an example embodiment of the present inventive concept. FIG. 6B is a plan view of the semiconductor package illustrated in FIG. 6A, according to an example embodiment of the present inventive concept.

Referring to FIGS. 6A and 6B, a semiconductor package 16 may include a heat spreader 150 including a bottom surface 150b having an even surface. The adhesive film 140 may extend along the bottom surface 150b of the heat spreader 150 in a sheet-type shape. The semiconductor package 16 may further include a plurality of through-holes 155 capable of emitting a bubble generated when the heat spreader 150 is bonded to the semiconductor chip 130. The through-holes 155 may be regularly distributed as illustrated in FIG. 6B. In an example embodiment of the present inventive concept, the through-holes 155 may be irregularly distributed as illustrated in FIG. 2C.

Figure 7:
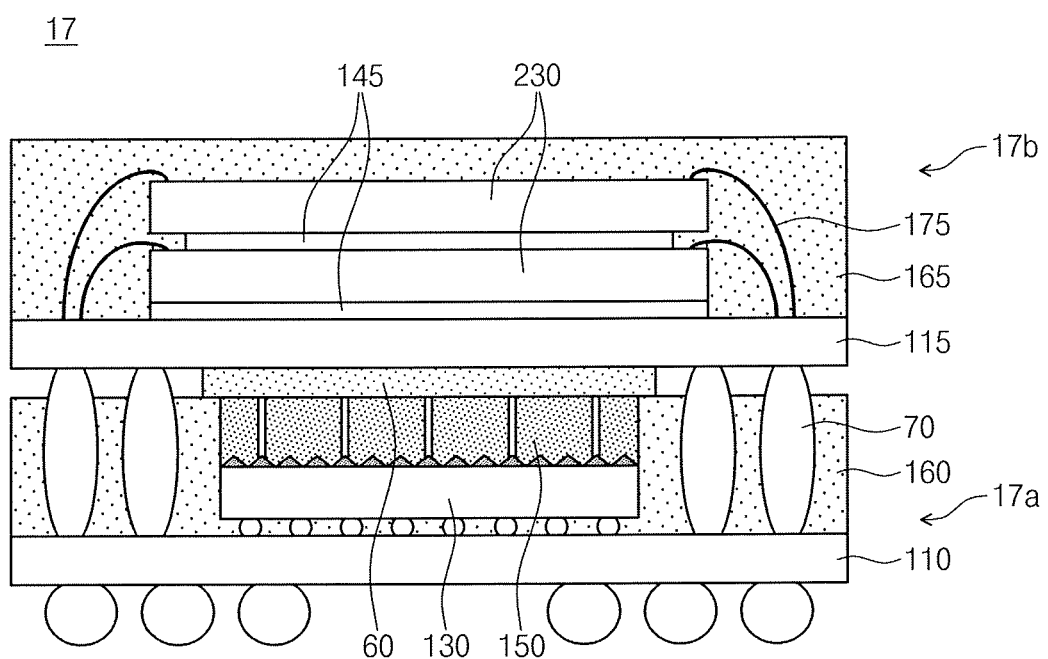
FIG. 7 is a cross-sectional view illustrating a semiconductor package according to an example embodiment of the present inventive concept.

FIG. 7 is a cross-sectional view illustrating a semiconductor package according to an example embodiment of the present inventive concept.

Referring to FIG. 7, a semiconductor package 17 may be a package-on-package (POP) type package in which an upper package 17b is stacked on a lower package 17a. The lower package 17a may include at least one of the semiconductor packages 11 to 16 described above. As an example, the semiconductor package 12 of FIG. 2A may be the lower package 17a.

The upper package 17b may include at least one upper semiconductor chip 230 mounted on an upper package substrate 115 with an adhesive member 145 interposed therebetween and an upper molding layer 165 covering the upper semiconductor chip 230. The upper semiconductor chip 230 may be electrically connected to the upper package substrate 115 via boning wires 175. The lower package 17a and the upper package 17b may be electrically connected to each other via internal connection terminals 70 passing through a molding layer 160 of the lower package 17a.

The semiconductor package 17 may further include a heat transfer layer 60 (e.g., a thermal interface material (TIM)) which is provided between the lower package 17a and the upper package 17b and is in contact with a heat spreader 150 of the lower package 17a. Heat which is transferred from a semiconductor chip 130 of the lower package 17a to the heat spreader 150 may be released to the outside of the semiconductor package 17 via the heat transfer layer 60 and the upper package substrate 115.

FIGS. 8A, 8B, 8C and 8D are cross-sectional views illustrating methods of manufacturing a semiconductor package according to an example embodiment of the present inventive concept. FIG. 8E is a plan view of a semiconductor package illustrated in FIG. 8D, according to an example embodiment of the present inventive concept. FIG. 8F is a plan view illustrating the semiconductor package illustrated in FIG. 8D, according to an example embodiment of the present inventive concept.

Referring to 8A, semiconductor chips 130 may be mounted on a package substrate 110 and heat spreaders 150 may be stacked on the semiconductor chips 130, respectively. In an example embodiment of the present inventive concept, the semiconductor chips 130 may be mounted on the package substrate 110 using the flip-chip bonding technique. Solder balls 125 may be disposed between the each of the semiconductor chips 130 and the package substrate 110 to connect the each of the semiconductor chips 130 to the package substrate 110. In an example embodiment of the present inventive concept, TSVs 129 illustrated in FIG. 1H may be formed in each of the semiconductor chips 130 to be connected to the solder balls 125. Each of the heat spreaders 150 may include a top surface 150a and a bottom surface 150b and have a plate-type shape. The top and bottom surfaces 150a and 150b may be even. In an example embodiment of the present inventive concept, the top surface 150a may be even and the bottom surface 150b may be uneven. For example, a surface roughness of the bottom surface 150b may be greater than that of the top surface 150a.

An adhesive film 140 may be attached to the heat spreaders 150. The adhesive film 140 may partially cover the top surface 150a of each of the heat spreaders 150 to expose a portion of the top surface 150a of each of the heat spreaders 150. The adhesive film 140 may include a thermosetting material.

Figure 8A:
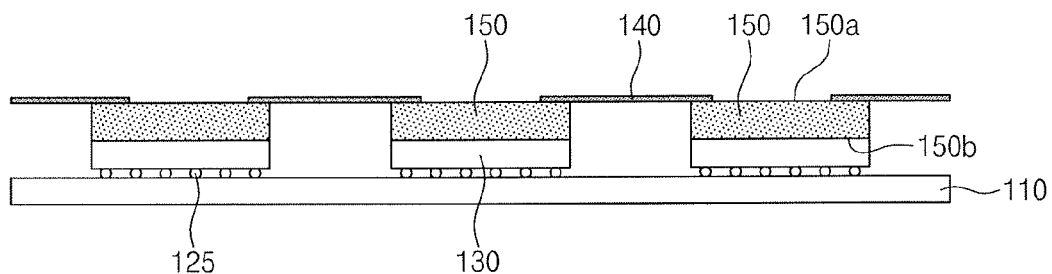
FIGS. 8A, 8B, 8C and 8D are a cross-sectional views illustrating a method of manufacturing a semiconductor package according to an example embodiment of the present inventive concept.
Figure 8B:
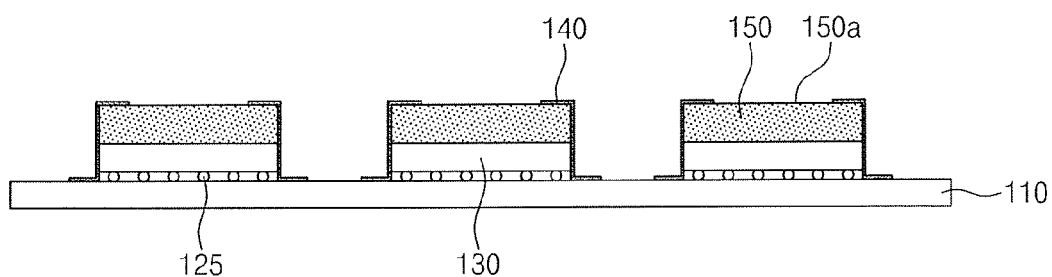

Referring to FIG. 8B, the adhesive film 140 may be attached to the package substrate 110 and the semiconductor chips 130. The adhesive film 140 may be cut to partially cover the top surface 150a of each of the heat spreaders 150, sidewalls of each of the heat spreaders 150 and sidewalls of each of the semiconductor chips 130. Further, the adhesive film 140 may extend to a top surface of the package substrate 110 from sides of each semiconductor chip 130 and bend to cover a portion of the top surface of the package substrate 110.

Figure 8C:
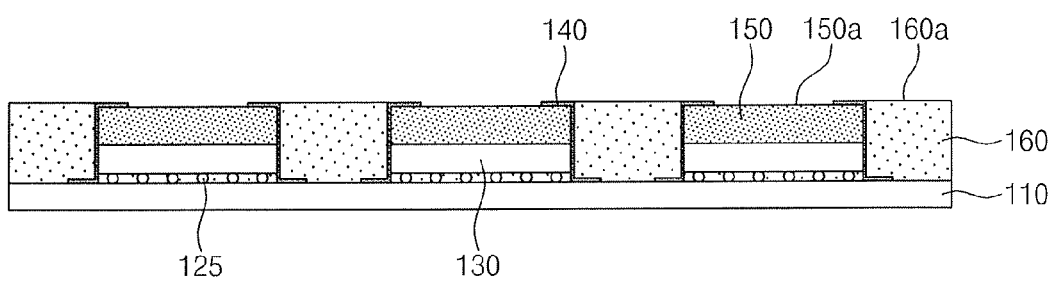

Referring to FIG. 8C, a molding layer 160 may be formed on the package substrate 110 to cover the sidewalls of the heat spreader 150 and each of the semiconductor chips 130. The molding layer 160 may be provided on and cover a portion of the adhesive film 140. A top surface 160a of the molding layer 160 may be at substantially the same level as the top surface 150a of the heat spreader 150. For example, the top surface 160a of the molding layer 160 and the top surface 150a of the heat spreader 150 may be substantially coplanar.

Figure 8D:
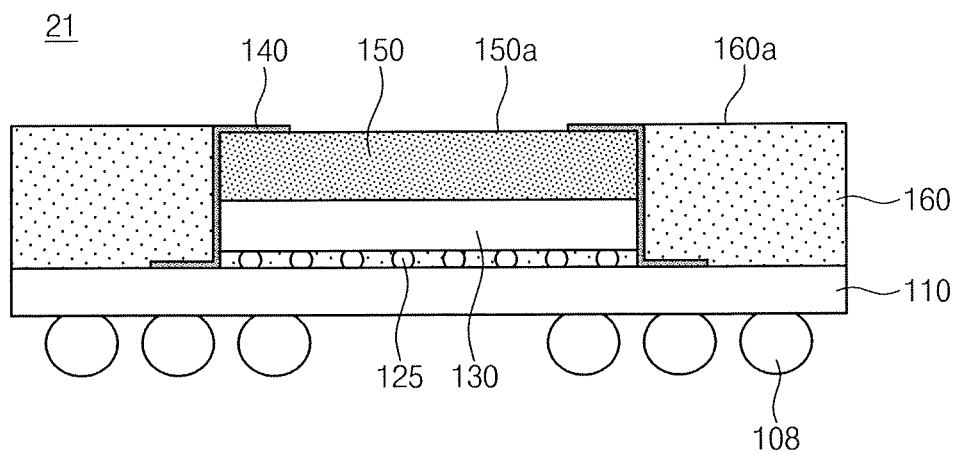
Figure 8E:
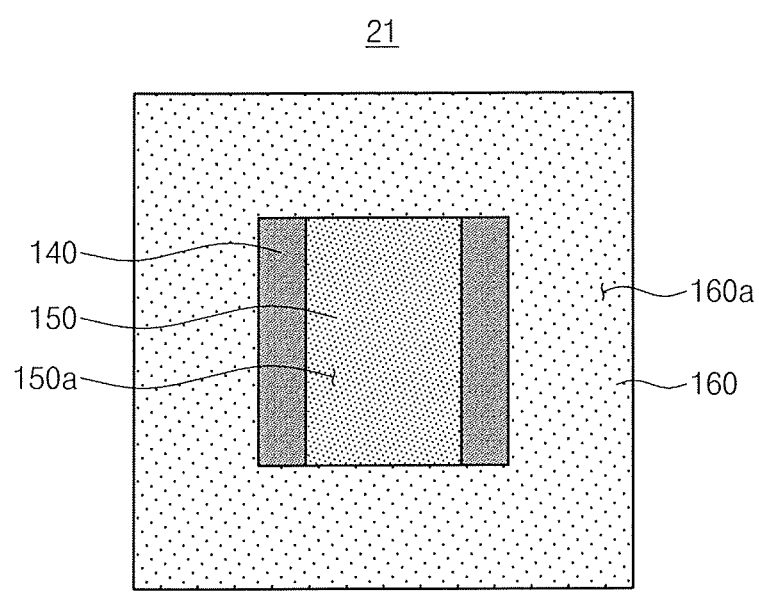
FIG. 8E is a plan view of a semiconductor package illustrated in FIG. 8D, according to an example embodiment of the present inventive concept.
Figure 8F:
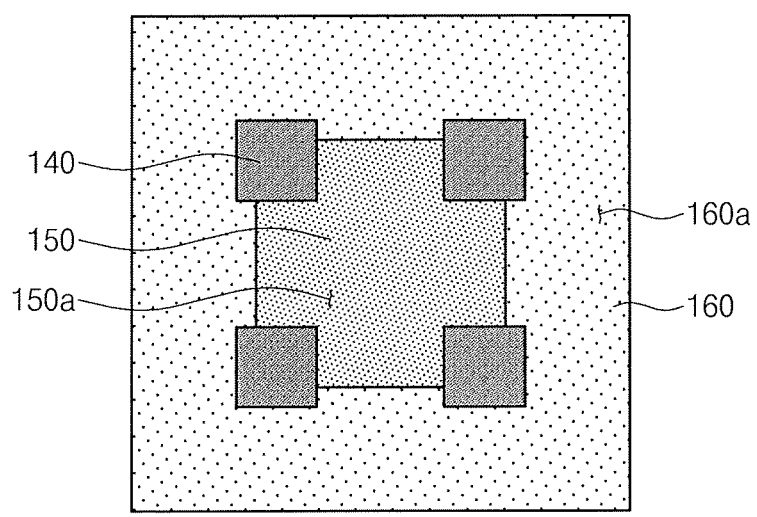
FIG. 8F is a plan view illustrating the semiconductor package illustrated in FIG. 8D, according to an example embodiment of the present inventive concept.

Referring to FIG. 8D, a semiconductor package 21 may be formed by a sawing process. For example, the package substrate 110 and the molding layer 160 may be sawed into individual package units to form the semiconductor package 21. Before the sawing process, external connection terminals 108 may be provided on a bottom surface of the package substrate 110. The adhesive film 140 may cover an entire peripheral region of the top surface 150a of the heat spreader 150. In an example embodiment of the present inventive concept, the adhesive film 140 may cover opposite peripheral regions of the top surface 150a of the heat spreader 150 as illustrated in FIG. 8E. In an example embodiment of the present inventive concept, the adhesive film 140 may cover edge regions of the top surface 150a of the heat spreader 150 as illustrated in FIG. 8F.

In accordance with an example embodiment of the present inventive concept, since the heat spreader 150 and the semiconductor chip 130 may be in direct contact with each other, the amount of heat transferred from the semiconductor chip 130 to the heat spreader 150 may be increased. Further, since the adhesive film 140 may be provided on a portion of the top surface 150a of the heat spreader 150 and a portion of the sidewalls of the heat spreader 150, and a portion of the sidewalls of the semiconductor chip 130 and the molding layer 160 may surround the sidewalls of the heat spreader 150 and the semiconductor chip 130, a stable bonding of the heat spreader 150 and the semiconductor chip 130 may be realized. Accordingly, a warpage of a semiconductor package 21 manufactured according to an example embodiment of the present inventive concept may be inhibited or reduced. In addition, thermosetting characteristics of the semiconductor package 21 may be increased due to the adhesive layer 140 including the thermosetting material.

Figure 9A:
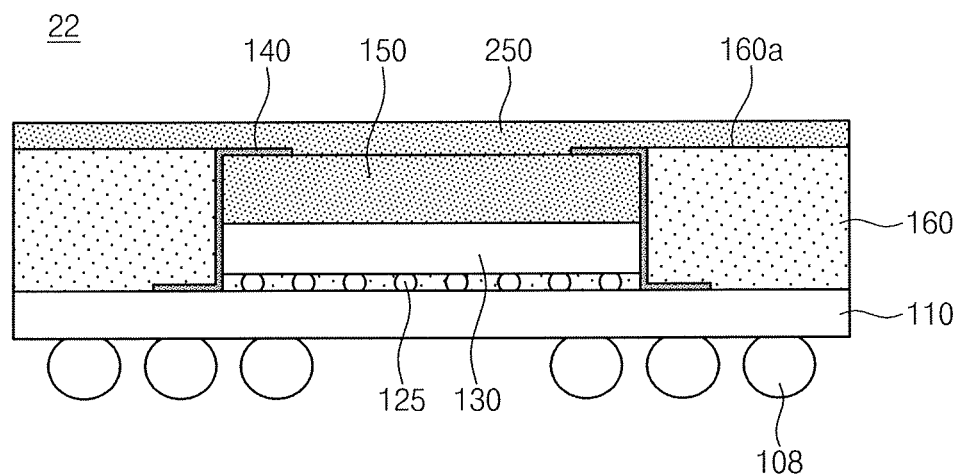
FIG. 9A is a cross-sectional view illustrating the semiconductor package illustrated in FIG. 8D, according to an example embodiment of the present inventive concept.
Figure 9B:
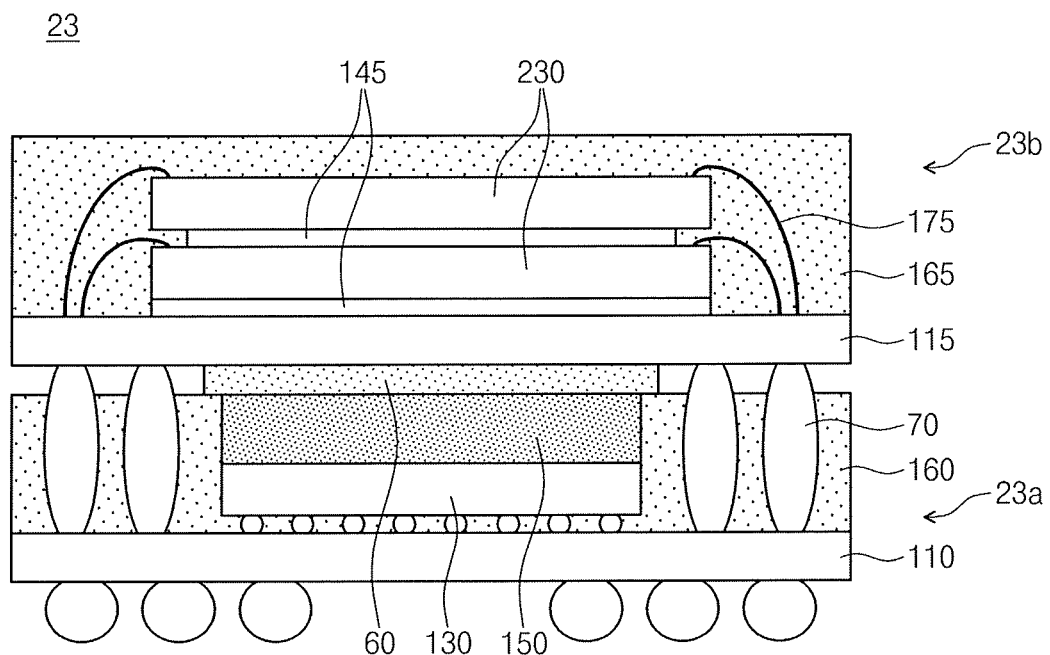
FIG. 9B is a cross-sectional view illustrating the semiconductor package illustrated in FIG. 8D, according to an example embodiment of the present inventive concept.

FIG. 9A is a cross-sectional view illustrating the semiconductor package illustrated in FIG. 8D, according to an example embodiment of the present inventive concept. FIG. 9B is a cross-sectional view illustrating the semiconductor package illustrated in FIG. 8D, according to an example embodiment of the present inventive concept.

Referring to FIG. 9A, a semiconductor package 22 may further include a supplemental heat spreader 250 which is stacked on the heat spreader 150. The supplemental heat spreader 250 may include the same or similar material as that of the heat spreader 150. The supplemental heat spreader 250 may include, for example, at least one of aluminum, copper, aluminum alloy, and/or copper alloy. The supplemental heat spreader 250 may have a plate shape extending from the top surface 150a of the heat spreader 150 to the top surface 160a of the molding layer 160. Due to the supplemental heat spreader 250, an area for releasing heat may be increased.

Referring to FIG. 9B, a semiconductor package 23 may be a package on package (POP) type package including a lower package 23a and an upper package 23b stacked on the lower package 23a. The lower package 23a may be the semiconductor package 21 illustrated in FIG. 8D. The upper package 23b may have the same or similar structure as that of the upper package 17b illustrated in FIG. 7.

The lower and upper package 23b and 23a may be electrically connected together by internal connection terminals 70 passing through the molding layer 160. The semiconductor package 23 may further include a heat transfer layer 60 (e.g., a TIM) which is provided between lower package 23a and the upper package 23b and is in contact with the heat spreader 150.

Figure 10A:
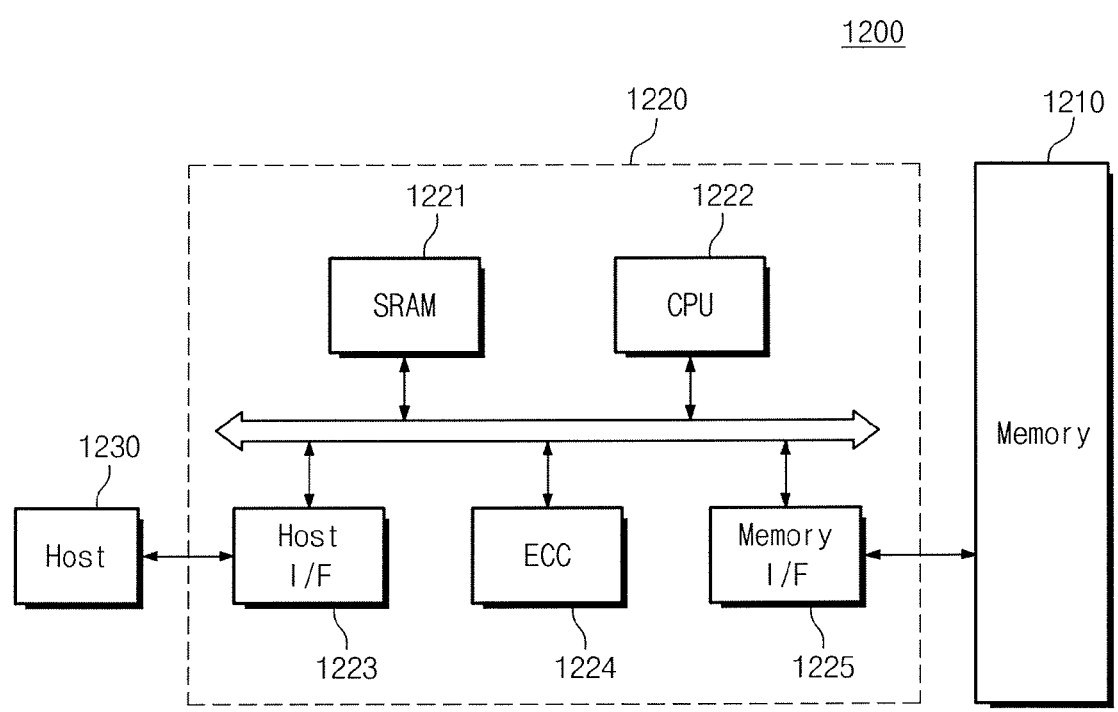
FIG. 10A is a schematic block diagram illustrating a memory system including at least one of the semiconductor packages according to an example embodiment of the present inventive concept.
Figure 10B:
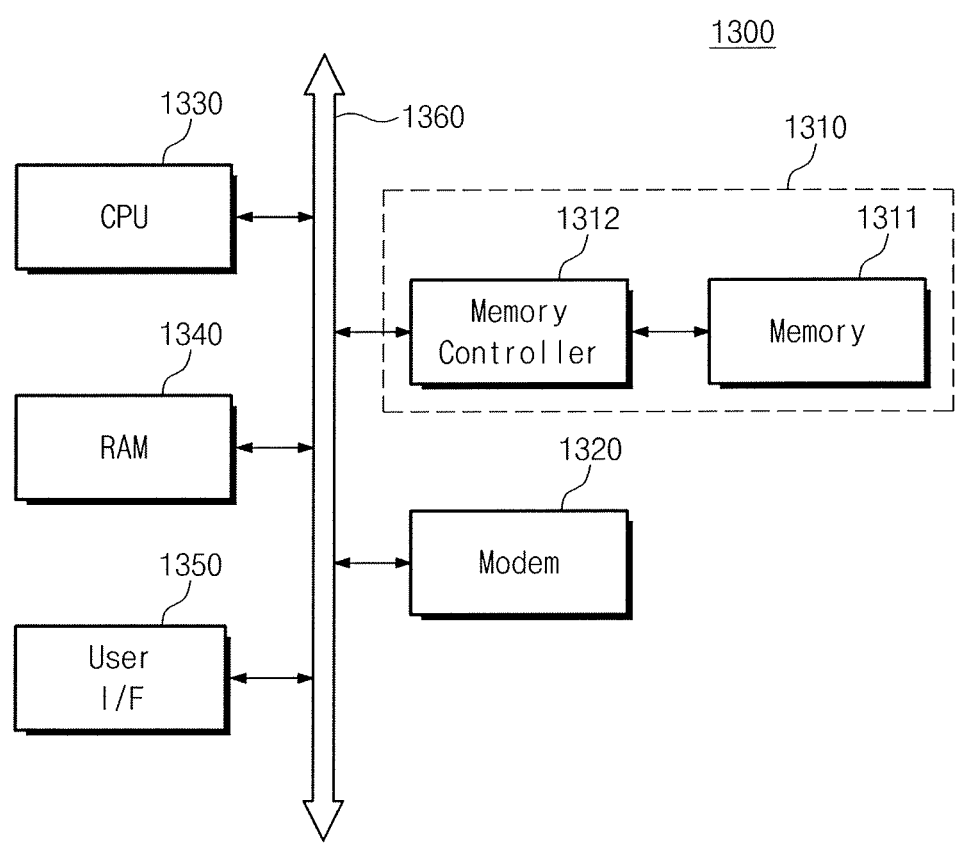
FIG. 10B is a schematic block diagram illustrating an electronic system including at least one of the semiconductor packages according to an example embodiment of the present inventive concept.

FIG. 10A is a schematic block diagram illustrating a memory system including at least one of semiconductor packages according to an example embodiment of the present inventive concept. FIG. 10B is a schematic block diagram illustrating an electronic system including at least one of semiconductor packages according to an example embodiment of the present inventive concept.

Referring to 10A, a memory system 1200 according to an example embodiment of the present inventive concept may be a semiconductor storage device. For example, the memory system 1200 may be a memory card or a solid state drive (SSD) device. The memory system 1200 may include a memory 1210 and a memory controller 1220 which controls data exchange between the memory 1210 and a host 1230. Static random access memory (SRAM) 1221 may be used as a working memory of a CPU 1222. A host interface unit 1223 may include a data exchange protocol of the host 1230 connected with the memory system 1200. An error correction code (ECC) unit 1224 may detect and correct errors in data read from the memory 1210. A memory interface unit 1225 may interface with the memory 1210. The CPU unit 1222 may perform various control operations for data exchange of the memory controller 1220. The memory 1210 and/or the memory controller 1220 may include at least one of the semiconductor packages according to an example embodiment of the present inventive concept.

Referring to FIG. 10B, an electronic system 1300 according to an example embodiment of the present inventive concept may include for example, a mobile device or a computer. The electronic system 1300 may include a memory system 1310 electrically connected to a system bus 1360, a modem 1320, a CPU 1330, a random access memory (RAM) 1340 and a user interface unit 1350. The memory system 1310 may include a memory 1311 and a memory controller 1312 the same as or similar to the memory system 1200 illustrated in the FIG. 10A. The memory system 1310 may store data and/or commands executed by the CPU 1330 and/or data input from the outside. The electronic system 1300 may be provided with a memory card, an SSD, a camera image sensor, and/or an application chip set. The memory system 1310, the central processing unit 1330, and/or any of the other elements of FIG. 10B may include at least one of the semiconductor packages according to an example embodiment of the present inventive concept.

Example embodiments of the present inventive concept may provide semiconductor packages with increased thermal and mechanical durability and a method for manufacturing the same.

While the present inventive concept has been described with reference to example embodiments thereof, it will be apparent to those skilled in the art that various changes and modifications may be made thereto without departing from the scope of the present inventive concept as defined by the following claims.

What is claimed is:

1. A semiconductor package, comprising:
a semiconductor chip on a package substrate;
a heat spreader on the semiconductor chip;
a molding layer covering sidewalls of the heat spreader and sidewalls of the semiconductor chip; and
an adhesive film disposed between the heat spreader and the semiconductor chip,
wherein the heat spreader comprises:
a first surface exposed by the molding layer; and
a second surface facing the semiconductor chip and having a surface roughness greater than a surface roughness of the first surface.

2. The semiconductor package of claim 1, wherein the adhesive film includes a thermosetting material.

3. The semiconductor package of claim 1, wherein the first surface of the heat spreader is even and the second surface of the heat spreader is uneven, and wherein a portion of the second surface of the heat spreader is directly in contact with the semiconductor chip.

4. The semiconductor package of claim 1, further comprising a plurality of through-holes penetrating the heat spreader and exposing the adhesive film.

5. The semiconductor package of claim 1, wherein the second surface of the heat spreader includes protrusion portions and recessed portions between the protrusion portions, and
wherein the protrusion portions directly contact the semiconductor chip and the adhesive film is in the recessed portions.

6. The semiconductor package of claim 5, wherein the protrusion portions have a sharp tip or a curved tip.

7. The semiconductor package of claim 5, wherein the protrusion potions have an even surface.

8. The semiconductor package of claim 1, wherein the adhesive film is on a portion of the first surface of the heat spreader, the sidewalls of the heat spreader and the sidewalls of the semiconductor chip.

* * * * *